(12) United States Patent
Mastro

(10) Patent No.: US 11,448,824 B2
(45) Date of Patent: Sep. 20, 2022

(54) DEVICES WITH SEMICONDUCTOR HYPERBOLIC METAMATERIALS

(71) Applicant: The Government of the United States of America, as represented by the Secretary of the Navy, Arlington, VA (US)

(72) Inventor: Michael A. Mastro, Fairfax, VA (US)

(73) Assignee: The Government of the United States of America, as represented by the Secretary of the Navy, Washington, DC (US)

( * ) Notice: Subject to any disclaimer, the term of this patent is extended or adjusted under 35 U.S.C. 154(b) by 630 days.

(21) Appl. No.: 15/075,580

(22) Filed: Mar. 21, 2016

(65) Prior Publication Data
US 2016/0274301 A1 Sep. 22, 2016

Related U.S. Application Data

(60) Provisional application No. 62/135,739, filed on Mar. 20, 2015.

(51) Int. Cl.
| G02B 1/00 | (2006.01) |
| G02B 6/122 | (2006.01) |
| G02B 6/12 | (2006.01) |
| G02F 1/017 | (2006.01) |
| H01S 5/10 | (2021.01) |
| H01S 5/323 | (2006.01) |

(52) U.S. Cl.
CPC ............ *G02B 6/1225* (2013.01); *G02B 1/002* (2013.01); *G02B 6/12004* (2013.01); *G02F 1/01708* (2013.01); *H01S 5/1046* (2013.01); *G02F 2202/30* (2013.01); *H01S 5/32341* (2013.01)

(58) Field of Classification Search
None
See application file for complete search history.

(56) References Cited

U.S. PATENT DOCUMENTS

| 7,790,230 | B2 | 9/2010 | Mastro et al. | |
| 7,928,471 | B2 | 4/2011 | Mastro et al. | |
| 8,237,152 | B2 | 8/2012 | Mastro | |
| 8,653,550 | B2 | 2/2014 | Mastro | |
| 9,927,675 | B2 * | 3/2018 | Huang | H01L 31/00 |
| 2002/0167023 | A1 * | 11/2002 | Chavarkar | H01L 29/7783 257/194 |

(Continued)

OTHER PUBLICATIONS

C.L. Cortes, W. Newman, S. Molesky, Z. Jacob, Quantum nanophotonics using hyperbolic metamaterials, J. Opt. 14, 063001 (2012).

(Continued)

*Primary Examiner* — Suberr L Chi
(74) *Attorney, Agent, or Firm* — US Naval Research Laboratory; Joslyn Barritt

(57) ABSTRACT

A hyperbolic metamaterial assembly comprising alternating one or more first layers and one or more second layers forming a hyperbolic metamaterial, the one or more first layers comprising an intrinsic or non-degenerate extrinsic semiconductor and the one or more second layers comprising a two-dimensional electron or hole gas, wherein one of in-plane or out-of-plane permittivity of the hyperbolic metamaterial assembly is negative and the other is positive.

18 Claims, 7 Drawing Sheets

(56) References Cited

U.S. PATENT DOCUMENTS

| | | | |
|---|---|---|---|
| 2006/0060131 A1* | 3/2006 | Atanackovic | H01L 33/34 257/E21.274 |
| 2007/0128743 A1* | 6/2007 | Huang | H01L 21/02458 438/21 |
| 2007/0205407 A1* | 9/2007 | Matsuo | H01L 33/007 257/E29.05 |
| 2008/0128745 A1* | 6/2008 | Mastro | H01L 31/1812 257/184 |
| 2008/0315216 A1* | 12/2008 | Otsuji | H01S 1/02 257/83 |
| 2011/0297961 A1* | 12/2011 | Bunin | H01L 29/42316 257/76 |
| 2014/0059830 A1* | 3/2014 | Morel | B82Y 20/00 29/428 |
| 2014/0197896 A1* | 7/2014 | Ouchi | H03B 7/08 331/107 T |
| 2014/0348191 A1* | 11/2014 | Morel | H01S 5/02476 372/34 |
| 2015/0285953 A1* | 10/2015 | Naik | H01L 51/5262 257/40 |

OTHER PUBLICATIONS

Z. Jacob, I.I. Smolyaninov, E.E. Narimanov, Appl. Phys. Lett. 100, 181105 (2012).
G. Naik, V. Shalaev, A. Boltasseva, Alternate Plasmonic Materials: Beyond Gold and Silver, Advanced Materials, 25, 3264 (2013).

* cited by examiner

DEVICES WITH SEMICONDUCTOR HYPERBOLIC METAMATERIALS

RELATED APPLICATIONS

This application claims the benefit of U.S. Provisional Application No. 62/135,739, filed Mar. 20, 2015, which is hereby incorporated herein in its entirety.

FIELD OF INVENTION

The present invention relates generally to metamaterials, and more particularly to a devices with semiconductors hyperbolic metamaterials.

BACKGROUND

Permittivity, or $\varepsilon$, describes electromagnetic (light) propagation in material. Metals have a permittivity less than zero while dielectrics have a permittivity greater than zero. In these "normal" materials, the permittivity is typically the same in all directions, thereby forming a sphere in k-space (momentum). However, hyperbolic metamaterials possesses components of opposite sign in the permittivity tensor, $$\varepsilon = \begin{bmatrix} \varepsilon_{xx} & 0 & 0 \\ 0 & \varepsilon_{yy} & 0 \\ 0 & 0 & \varepsilon_{zz} \end{bmatrix},$$

where the in-plane components themselves are equal $\varepsilon_{xx}=\varepsilon_{yy}$, but unequal to the perpendicular component $\varepsilon_{zz}$, that is, $\varepsilon_{zz} \neq \varepsilon_{xx}=\varepsilon_{yy}$. [C. L. Cortes, W. Newman, S. Molesky, Z. Jacob, Quantum nanophotonics using hyperbolic metamaterials, J. Opt. 14, 063001 (2012)] Hyperbolic metamaterials are made by alternating layers of metal and dielectric to achieve this "abnormal" permittivity tensor.

The opposing sign in the components in the permittivity tensor, $\varepsilon_{zz}\varepsilon_{xx}<0$, creates a hyperbolic isofrequency curve in k-space as described by $$\frac{k_x^2 + k_y^2}{\varepsilon_{zz}} + \frac{k_z^2}{\varepsilon_{xx} + \varepsilon_{yy}} = \frac{\omega^2}{c^2} = k_0^2,$$

where $k_0$ is the free space wavevector, $\omega$ is the angular frequency, and c is the speed of light. For example, FIG. 1A depicts a type-2 hyperbolic metamaterial where $\varepsilon_{zz}=\varepsilon_{yy}<0$ and $\varepsilon_{zz}>0$. In a type-2 hyperbolic metamaterial, electromagnetic waves can propagate in-plane with very large wavevectors. Ignoring the $k_y$ plane for illustration and setting the $k_z$ component to zero then the minimum allowed $k_x$ wavevector (for a fixed frequency) is $$k_{x-min}^2 = \varepsilon_{zz}\frac{\omega^2}{c^2} = \varepsilon_{zz}k_0^2.$$

This hyperbolic isofrequency curve is in contrast to the circular isofrequency curve present in most natural materials This has interesting consequence when one considers the same information in the $k_x$:$k_z$ plane in FIG. 1B. The circular isofrequency curves of air (free space) and in GaN are also presented.

A type-1 metamaterial, where $\varepsilon_{zz}<0$ and $\varepsilon_{xx}=\varepsilon_{yy}>0$, is shown in FIG. 3 and FIG. 4.

SUMMARY OF INVENTION

However, there are some disadvantages to making hyperbolic metamaterials with metal layers. In particular, metal layers have inherent loss and must be deposited extremely thin. Thin metal deposition is difficult to achieve without surface roughening, which creates additional optical-loss. Highly doped oxides can be used, but the doping levels required for producing a plasma frequency in the near-infrared creates material defects that also lead to high optical-loss.

Therefore, provided are designs and methods to create exemplary semiconductor based assemblies with a periodic sequence of electron or hole gas layers formed in the interfaces between layers of semiconductor material having a low carrier concentration (i.e., an intrinsic or non-degenerate extrinsic semiconductor, rather than a degenerate semiconductor). In other words, the "metal layer" of the metamaterial has been replaced by a two-dimensional electron (or hole) gas, and the undoped or low-doped semiconductor regions behave as the dielectric and a positive permittivity. Exemplary multilayer structures display hyperbolic metamaterial properties, which either improves or is the basis of operation of the assemblies.

According to one aspect of the invention, a hyperbolic metamaterial assembly includes alternating one or more first layers and one or more second layers forming a hyperbolic metamaterial, the one or more first layers have an intrinsic or non-degenerate extrinsic semiconductor and the one or more second layers have a two-dimensional electron or hole gas. One of in-plane or out-of-plane permittivity of the hyperbolic metamaterial assembly is negative and the other is positive.

Optionally, the one or more first layers comprise alternating layers of 3 nm AlN and 20 nm GaN, and the one or more second layers are formed in potential wells at an interface between the alternating layers of AlN and GaN.

Optionally, the two-dimensional electron or hole gas is formed by polarization fields at a III-nitride heterointerface.

Optionally, the heterointerface is an AlN/GaN interface.

Optionally, the two-dimensional electron or hole gas is formed by bandgap engineering fields at a semiconductor heterointerface.

Optionally, the heterointerface is an AlN/GaN interface.

Optionally, the heterointerface is an AlGaAs/GaAs interface.

Optionally, the hyperbolic metamaterial assembly includes a semiconductor light emitter, and the hyperbolic metamaterial is configured to guide electromagnetic waves that are emitted by the light emitter away from said light emitter toward a photodetector.

Optionally, the hyperbolic metamaterial assembly includes a semiconductor light emitter, and the hyperbolic metamaterial is configured to reflect light emitted by the light emitter out of the assembly, thereby enhancing light recycling.

Optionally, the hyperbolic metamaterial assembly includes a semiconductor light emitter positioned between the hyperbolic metamaterial and a reflector, and the hyperbolic metamaterial and the reflector are configured to reflect light emitted by the light emitter toward each other, thereby enhancing the Q-factor of the cavity formed therebetween.

Optionally, the hyperbolic metamaterial assembly includes a semiconductor light emitter with an active region built within the hyperbolic metamaterial and configured to produce strong light-matter coupling.

Optionally, the hyperbolic metamaterial assembly includes a semiconductor light emitter with an active region built on or within the hyperbolic metamaterial and configured to produce amplified spontaneous emission or thresholdless lasing.

Optionally, the hyperbolic metamaterial assembly includes a light detector evanescently coupled to the hyperbolic metamaterial.

Optionally, the hyperbolic metamaterial assembly includes a controller configured to apply a voltage bias to the hyperbolic metamaterial, thereby modulating the carrier concentration therein.

Optionally, the hyperbolic metamaterial assembly includes a light emitter, and the hyperbolic metamaterial is configured as an optical waveguide with respect to light emitted from the light emitter, and the controller is configured to modulate the optical properties of the hyperbolic metamaterial.

Optionally, the hyperbolic metamaterial assembly includes a light emitter and a controller. The controller is configured to modulate light emitted from the light emitter, encoding information in the modulated light.

Optionally, the modulated light emitted from the light emitter has a modulation frequency higher than a rate perceivable by a human eye.

Optionally, the hyperbolic metamaterial assembly includes a light bulb housing having an electrical interface, thereby configuring the hyperbolic metamaterial assembly for use in a light socket.

Optionally, the hyperbolic metamaterial assembly includes a display screen backlit by the light emitter.

Optionally, the light emitter may be used to send a modulated signal between various objects such as two cars for communication. The modulation rate can be set at a level that cannot be distinguished by the human eye.

Optionally, the assembly may serve as white light source in automobiles, general room or outside lighting, LCD or similar backlight.

Optionally, the hyperbolic metamaterial assembly includes a transistor built on or in the hyperbolic metamaterial, and the hyperbolic metamaterial is configured to dissipate heat produced by the transistor.

Optionally, an exemplary assembly includes a substrate such as Si, Ge, sapphire, silicon carbide, GaN, AlN, GaAs, or GaP.

Optionally, an evaporation, sputtering or similar technique may be used to form a conductive metal layer to provide contact to the diode junction of an exemplary assembly.

According to another aspect of the invention, a superlattice of 2DEG layers in a low-doped semiconductor host that behaves as a hyperbolic metamaterial.

According to another aspect of the invention, a superlattice of 2DEG and 2D hole gas layers in a low-doped semiconductor host that behaves as a hyperbolic metamaterial.

According to another aspect of the invention, a light emitter built on or with an active region built within a semiconductor hyperbolic metamaterial with enhanced emission, enhanced emission rate, or both.

According to another aspect of the invention, a light emitter or photovoltaic device is built near a semiconductor hyperbolic metamaterial where the reflectance of the metamaterial enhances light recycling.

According to another aspect of the invention, a light emitter is built near a semiconductor hyperbolic metamaterial where the reflectance of the metamaterial improves the Q-factor of the cavity formed with another metamaterial, bragg mirror, or metallic mirror.

According to another aspect of the invention, a light emitter has an active region built within a semiconductor hyperbolic metamaterial for strong light-matter coupling.

According to another aspect of the invention, a light emitter has an active region built on or within a semiconductor hyperbolic metamaterial for amplified spontaneous emission or thresholdless lasing.

According to another aspect of the invention, a semiconductor type-2 hyperbolic metamaterial acts as an optical waveguide According to another aspect of the invention, a light emitter or detector is built on a type 2 semiconductor hyperbolic metamaterial waveguide where the light emitter or detector evanescently couples to the metamaterial.

According to another aspect of the invention, a transistor such as a HEMT is built on or in a semiconductor hyperbolic metamaterial for enhanced dissipation of heat.

According to another aspect of the invention, a phototransistor such as a HEMT is built on or in a semiconductor hyperbolic metamaterial for enhanced responsivity.

According to another aspect of the invention, a solar cell is built on or in a semiconductor hyperbolic metamaterial for enhanced light collection.

According to another aspect of the invention, a semiconductor hyperbolic metamaterial has a voltage bias applied to modulate the carrier concentration in the structure and thus the properties of the hyperbolic metamaterial According to another aspect of the invention, a semiconductor hyperbolic metamaterial waveguide where a voltage bias is applied to modulate the frequency dependent reflectance or transparency of the waveguide According to another aspect of the invention, a semiconductor hyperbolic metamaterial with metallic, poly-silicon, conductive oxide, or similar includes a gate in which the properties of the gate are used to enhance the properties of the overall metamaterial structure.

According to another aspect of the invention, a package with light emitter or detector coupled to a semiconductor hyperbolic metamaterial where the package is used for light communication through a waveguide, air, or water.

According to another aspect of the invention, a Metal Organic Chemical Vapor Phase Deposition (MOCVD) growth process can deposit the semiconductor hyperbolic metamaterial although this structure can be created by molecular beam epitaxy (MBE), hydride vapor phase epitaxy (HVPE), pulsed laser deposition (PLD), atomic layer deposition (ALD), aqueous solution, hydrothermal, solvothermal and variants.

According to another aspect of the invention, 2DEG forms in potential wells at the AlN/GaN interface of an alternating sequence of 3 nm AlN and 20 nm GaN.

According to another aspect of the invention, deposition or selective area deposition of an InGaN-based light emitting structure on the semiconductor hyperbolic metamaterial occurs.

The foregoing and other features of the invention are hereinafter described in greater detail with reference to the accompanying drawings.

DETAILED DESCRIPTION OF THE INVENTION

Light propagating in air with a certain angle relative to material slab (and thus $k_x$ wavevector) can only propagate into another material by matching the transverse wavevectors, e.g., $k_{x-Air}=k_{x-GaN}$. Light traveling from air at any angle relative to the GaN slab can propagate into the GaN given that a transverse component in GaN, $k_{x-GaN}$, on the isofrequency curve is accessible for all possible transverse components in air, $k_{x-Air}$. In contrast, only light propagating in GaN within a narrow angular cone relative to the air/GaN interface can propagate into the air by matching an available transverse wavevector in air. Light propagating in GaN at a larger angle relative to the surface normal cannot match the transverse wavevector and thus cannot propagate into the air, and will suffer from total internal reflection.

Figure 1A:
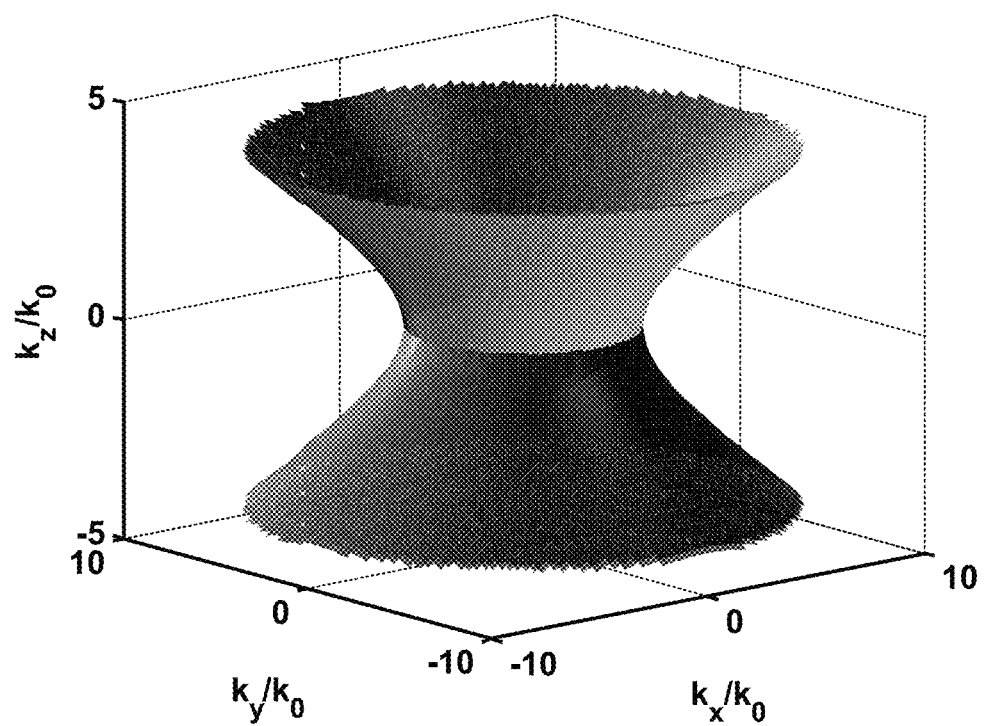
FIG. 1A is an isofrequency contour plot of a type-2 hyperbolic metamaterial in k-space.
Figure 1B:
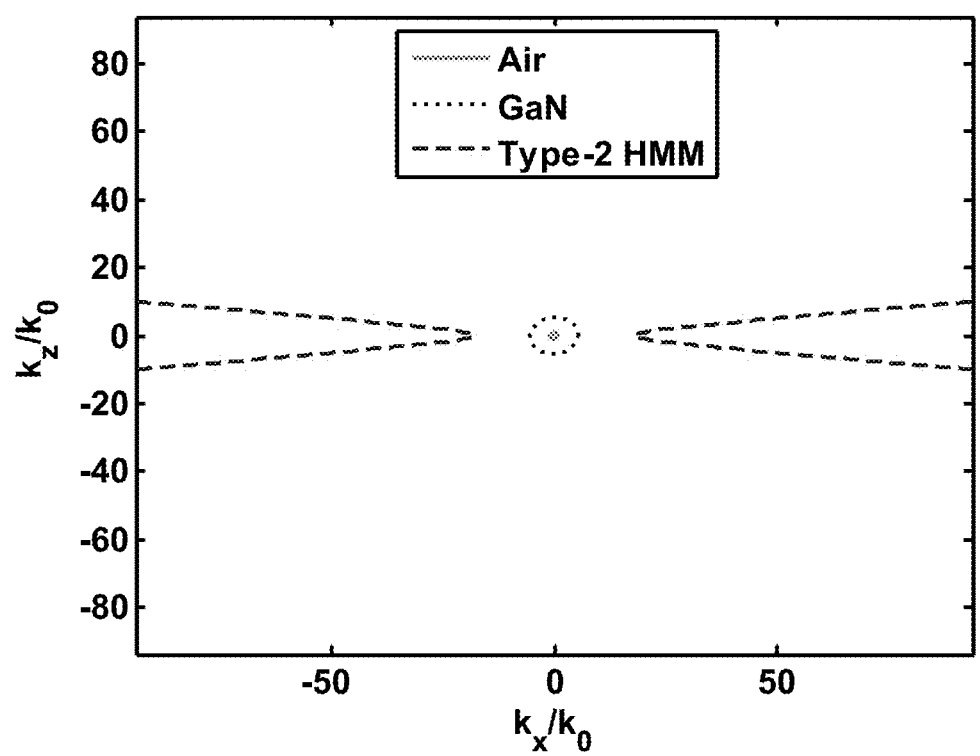
FIG. 1B is an isofrequency contour plot of a type-2 hyperbolic metamaterial in k-space.

Examining FIG. 1B, one sees that any electromagnetic wave propagating in the type-2 hyperbolic metamaterial cannot match the transverse wavevector of air (or GaN) and cannot propagate into the air (or GaN). This is advantageous for constructing optical waveguides for in-plane propagation without loss into the surrounding air or material (e.g., GaN, SiO$_2$, Si).

Figure 2A:
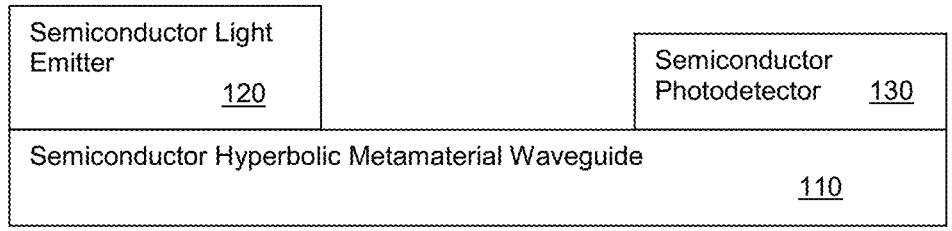
FIG. 2A is a schematic of an exemplary hyperbolic metamaterial assembly utilizing a hyperbolic metamaterial as a waveguide between a light emitter and a detector.

An example schematic of an exemplary metamaterial assembly 100 is shown in FIG. 2A. An emitter 120 may be optically coupled to a waveguide 110 such that light emitted by the emitter 120 is transmitted via total internal reflection away from the emitter 120. In the example shown, a detector 130 is optically coupled to the waveguide 110 at a distance removed from the emitter 120, and detects light transmitted through the waveguide—for example, the light emitted by the emitter 120. Launching an electromagnetic wave into a waveguide 110 is possible by building the emitter 120 inside the metamaterial, employing a grating, or by relying on evanescent coupling, for example. The small mode volume of large wavevectors enables tight confinement in metamaterial waveguides.

For a metamaterial laser, the small mode volume of large wavevectors would allow this metamaterial to act as an optical cavity where the optical mode can be sub-diffraction in size. The active semiconductor region can be located adjacent to or within the metamaterial. This design can allow amplified spontaneous emission or thresholdless lasing.

Figure 2B:
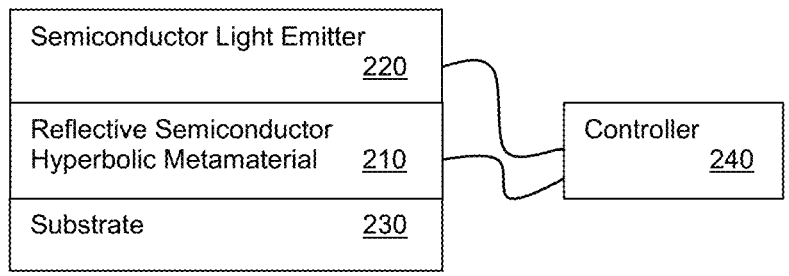
FIG. 2B is a schematic of an exemplary hyperbolic metamaterial assembly utilizing a hyperbolic metamaterial as a reflector in a light source.

Another use of this forbidden propagation is to use the type-2 hyperbolic metamaterial as a reflector in a light emitting structure. This simply could be used to reflect light generated in the active region away form a lossy substrate such as Si as shown in FIG. 2B. An exemplary light emitting assembly 200 includes a reflective hyperbolic metamaterial 210 optically coupled to a light emitter 220 and interposed between the emitter and a lossy substrate 230. The metamaterial 210, therefore, reflects light emitted by the emitter 220 towards the substrate 230 away from that substrate 230, thereby increasing the net efficiency of the assembly 200.

In any embodiment, an optional controller may be included to control various aspects of the assembly via electrical signal. An example is illustrated in FIG. 2B that includes a controller 240 electrically coupled to the emitter 220 and the hyperbolic metamaterial 210.

The controller 240 may be configured to apply a voltage bias to the hyperbolic metamaterial 210, thereby modulating the carrier concentration therein. Such modulation may include modulating the optical properties of the hyperbolic metamaterial, such as, for example, reflectivity or transparency. Information may be encoded in these properties by changing the amount of light reflected or transmitted by/through the metamaterial 210. In cases involving a metamaterial 210 configured for purposes other than light reflection or transmission, other properties may be modulated—for example, heat dissipation.

Alternatively or additionally, the controller 240 may be configured to modulate light emitted from the light emitter, encoding information in the modulated light.

In any case, the modulated light emitted from the light emitter (or the light that is reflected by or transmitted through the waveguide) may have a modulation frequency higher than a rate perceivable by a human eye, for example, a rate of 100 Hz or greater. Information may be encoded, for example, in the frequency of pulsed light, in the brightness of the light, or in the duty cycle of the light.

Exemplary embodiments, for example, those described in relation to FIG. 2B, may be a portion of a larger assembly for use in household goods. For example, exemplary assemblies may serve as white light source in automobiles, general room or outside lighting, LCD or similar backlight.

For example, exemplary assemblies may include a light bulb housing having an electrical interface, thereby configuring the hyperbolic metamaterial assembly for use in a light socket. Optionally, the light emitter may be used to send a modulated signal between various objects such as two cars for communication.

As another example, an exemplary assembly includes a display screen (e.g., an LCD screen) backlit by the light emitter. Such screen may be backlit by an array of said assemblies, each element in the array being individually actuated to encode information.

Figure 2C:
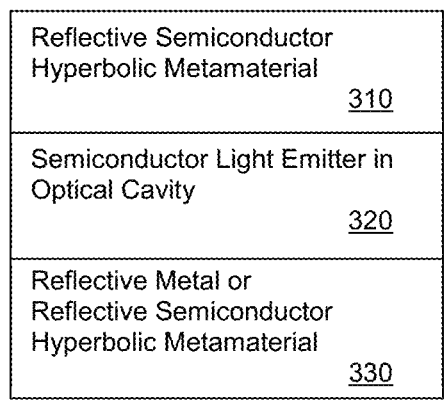
FIG. 2C is a schematic of an exemplary hyperbolic metamaterial assembly utilizing a hyperbolic metamaterial as a reflector forming, with another reflector, an optical cavity.

Another aspect of the invention would be to use the type-2 hyperbolic metamaterial as a reflective surface as part of the cavity that surrounds the light emitting layers as in a resonant cavity light emitting diode or a polariton laser as shown in the assembly 300 depicted in FIG. 2C. In this exemplary embodiment, a hyperbolic metamaterial 310 is optically coupled to a light emitter 320. On the side opposite the metamaterial 310, and forming an optical cavity therebetween in which resides the emitter, is another reflector 330. This reflector 330 may be any suitable reflector, for example a reflective metal or another hyperbolic metamaterial.

Figure 3:
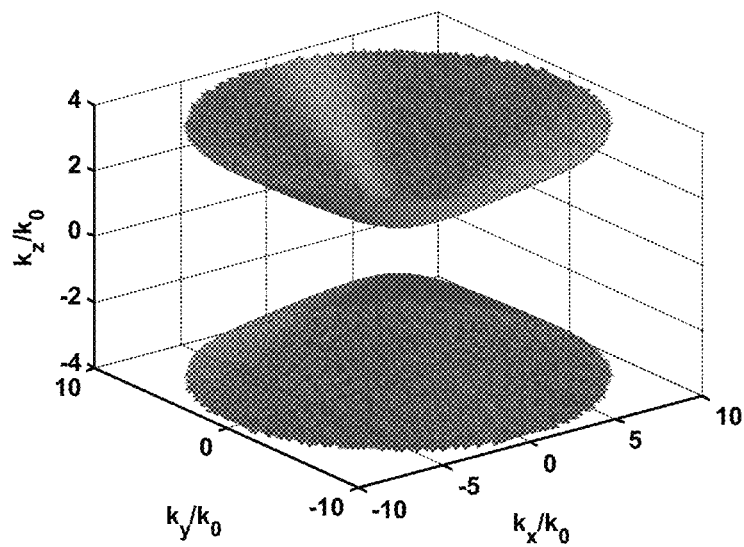
FIG. 3 is an isofrequency contour plot of a type-1 hyperbolic metamaterial in k-space.
Figure 4:
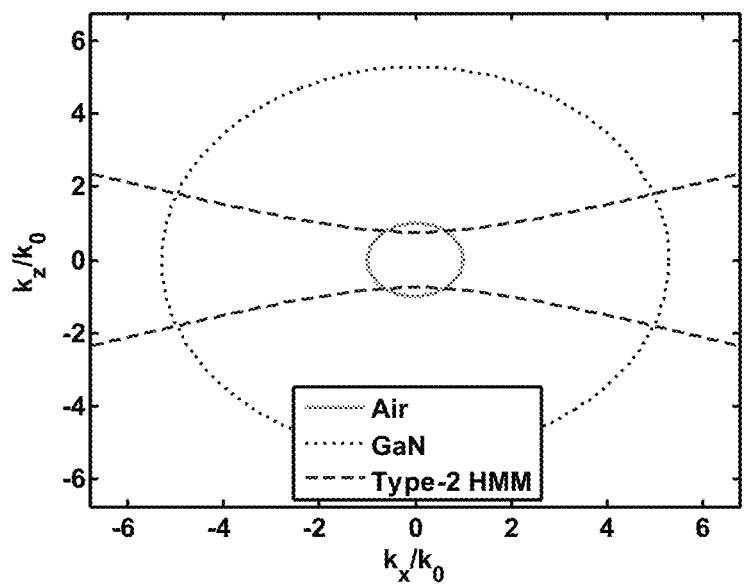
FIG. 4 is an isofrequency contour plot of a type-1 hyperbolic metamaterial in k-space.

FIG. 3 and FIG. 4 shows the structure of a type-1 hyperbolic metamaterial where $\varepsilon_{xx}=\varepsilon_{yy}>0$ and $\varepsilon_{zz}>0$. In a type-1 hyperbolic metamaterial, $$k_z^2 = \varepsilon_{xx}\left[k_0^2 - \frac{k_x^2 + k_y^2}{\varepsilon_{zz}}\right],$$

is parabolic. Large transverse wavevectors are present in the type-1 hyperbolic metamaterial. It should be noted that the parabolic relation does not hold as the wavevector approaches the physical dimensions of the unit cell with resultant diffraction effects. A type-1 hyperbolic metamaterial has a high density of states, which can prove advantageous for enhancement of the radiative rate of an emitter via a broadband Purcell effect. This enhancement in the radiative rate is advantageous for emitters used in communication which require a rapid cycling of on/off states. Power flow is described by the Poynting vector, which is perpendicular to the dispersion curve as shown in the dispersion curve in FIG. 3 and FIG. 4. Therefore the power flow is contained within the asymptotes of the perpendicular hyperbola as set by the angular cone given by $\tan(\theta)=\sqrt{\varepsilon_{xx}/|\varepsilon_{zz}|}$. A type-1 metamaterial can be used for highly directional emission where the beam is confined to a subdiffraction cone when $|\varepsilon_{zz}|\gg\varepsilon_{xx}$ [Z. Jacob, I. I. Smolyaninov, E. E. Narimanov, Appl. Phys. Lett. 100, 181105 (2012)]

Hyperbolic metamaterials are formed as a periodic metal/dielectric structure with dimensions, $\lambda/10$ to $\lambda/100$, much smaller than the wavelength of light. The two most common structures are vertical metallic nanowires in a dielectric matrix, and alternating metal/dielectric layers as a superlattice. In the superlattice the effective perpendicular permittivity can be expressed by $$\varepsilon_\perp = \frac{\varepsilon_{Metal}\varepsilon_{Dielectric}}{f\varepsilon_{Metal}+(1-f)\varepsilon_{Dielectric}} = \frac{1}{\frac{d_{Metal}/\varepsilon_{Metal}+d_{Dielectric}/\varepsilon_{Dielectric}}{d_{Metal}+d_{Dielectric}}},$$

where f is the fill fraction of the metal. This equation shows that the negative effective perpendicular permittivity is possible when the permittivity of the metal is also negative, which occurs for frequencies below the plasma frequency. Metals such as silver and gold, have plasma frequencies in the visible, are relatively low-loss compared to other metals, and are thus commonly used as the metallic component in the metamaterial.

Additionally, in the superlattice the parallel permittivity can be expressed by $$\varepsilon_\| = f\varepsilon_{Metal}+(1-f)\varepsilon_{Dielectric} = \frac{d_{Metal}\varepsilon_{Metal}+d_{Dielectric}\varepsilon_{Dielectric}}{d_{Metal}+d_{Dielectric}}.$$

Here the negative permittivity of the metal must overcome the positive dielectric permittivity to achieve an effective negative parallel permittivity. According to the Drude model, the metallic permittivity becomes more negative for lower frequencies (longer wavelengths). Therefore, the parallel permittivity typically becomes negative only at wavelengths slightly longer than the metal plasma frequency.

In general, the optimal hyperbolic metamaterial would have a metallic material that exhibits little loss. Additionally, it is often beneficial if the absolute values of metal and dielectric permittivities are within one order of magnitude, so that the response of the metamaterial can be designed with metallic layers of reasonable thickness. Far below the plasma frequency, metals display a negative permittivity two or three orders of magnitude larger than the dielectric permittivity. This necessitates thin metallic layers, which are difficult to produce and often exhibit losses arising from surface roughening.

Moreover, bulk metals, even gold and silver, show fairly high loss (as represented by the imaginary component of the permittivity) near the plasma frequency and far below the plasma frequency. [G. Naik, V. Shalaev, A. Boltasseva, Alternate Plasmonic Materials: Beyond Gold and Silver, Advanced Materials, 25, 3264 (2013)]

The Lorentz model for a metal or dielectric is $$\varepsilon(\omega) = \varepsilon_0 + \frac{\varepsilon_0 \frac{Ne^2}{m\varepsilon_0}}{\omega_0^2 + \omega + j\gamma\omega}$$

where $\gamma$ is the collisions per unit time, $\tau=1/\gamma$, is the mean time between collisions, and the plasma frequency $$\omega_p^2 = \frac{Ne^2}{m\varepsilon_0}$$

is proportional to the carrier concentration N.

Decreasing the metal plasma frequency requires diluting the number of carriers. This has been attempted by alloying the metal with a less conductive substance but generally this results in a large increase in $\gamma$ and, consequently, loss. Rather than decreasing the plasma frequency in a metal, another technique is to degenerately dope a semiconductor to increase the plasma frequency. Deposition technologies such as, for example, metal organic chemical vapor phase deposition (MOCVD), molecular beam epitaxy (MBE), and atomic layer deposition (ALD) can easily deposit very thin semiconductor layers with high doping levels. Heavily doping a semiconductor creates more carriers from the ionized donors (or acceptors). Nevertheless, it is these same ionized donors that create scattering centers that decrease the mobility and similarly increase the loss factor $\gamma$. Furthermore, the plasma frequency of a typical moderately doped semiconductor is in the mid-IR. Shifting the plasma frequency into the visible requires doping levels beyond the solubility limit of most semiconductors.

Exemplary designs described herein utilize a two-dimensional electron gas (2DEG) (or two-dimensional hole gas) as the metallic layer and the low-doped semiconductor layers as the dielectric in the hyperbolic metamaterial. A 2DEG is formed in materials such as AlGaAs/GaAs by bandgap engineering wherein doping in the AlGaAs barrier creates carriers that spill into a potential well (at the AlGaAs/GaAs interface) that is spatially displaced from the ionized donors. This displacement allows the carriers to experience few scattering events and thus move with a high mobility.

A related design in the III-nitride system relies on the large polarization fields that are present at the heterostructure interfaces. For example, a 25 nm AlGaN layer on a GaN film will create a polarization charge at the AlGaN/GaN interface that will accumulate carriers on the order of $1\times10^{13}$ electrons/cm$^2$ with a mobility greater than 1000 cm$^2$/(V-s). Various doping profiles can be used to modify the characteristics of the device but this high electron mobility transistor structure is commonly demonstrated without any intentional doping. A more extreme design employs a 3 nm AlN layer on a GaN film. This structure will have a much larger polarization field at the AlN/GaN interface and will accumulate carriers on the order of $5\times10^{13}$ electrons/cm$^2$.

The effective 2DEG thickness is determined by the width of the potential well. A simple AlN/GaN interface will have a triangular potential on the GaN side of the interface where most of the carriers are contained within the first three nanometers. The spatial distribution of the charge carriers can be modified by modifying the composition and dimensions of the layer in and adjacent to the potential well.

Creating a number of 2DEG layers in a superlattice requires sufficient spacing and bandgap engineering for each well to drop below the Fermi level. This spacing depends on the doping level and bandstructure of the layers but, in general, 20 nm of GaN can allow some significant quantity of carriers to accumulate in the wells.

Furthermore, this 2DEG superlattice can be gated to modulate the Fermi level, alter the number of carriers in the well, and thus electrically modulate the properties of the metamaterial.

Figure 5:
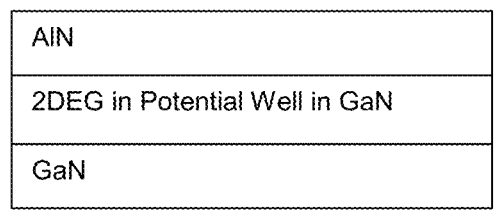
FIG. 5 is a schematic of an exemplary semiconductor hyperbolic metamaterial subunit.
Figure 6:
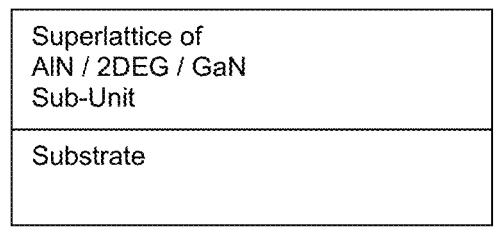
FIG. 6 is a schematic of an exemplary semiconductor hyperbolic metamaterial subunit on a substrate.
Figure 7A:
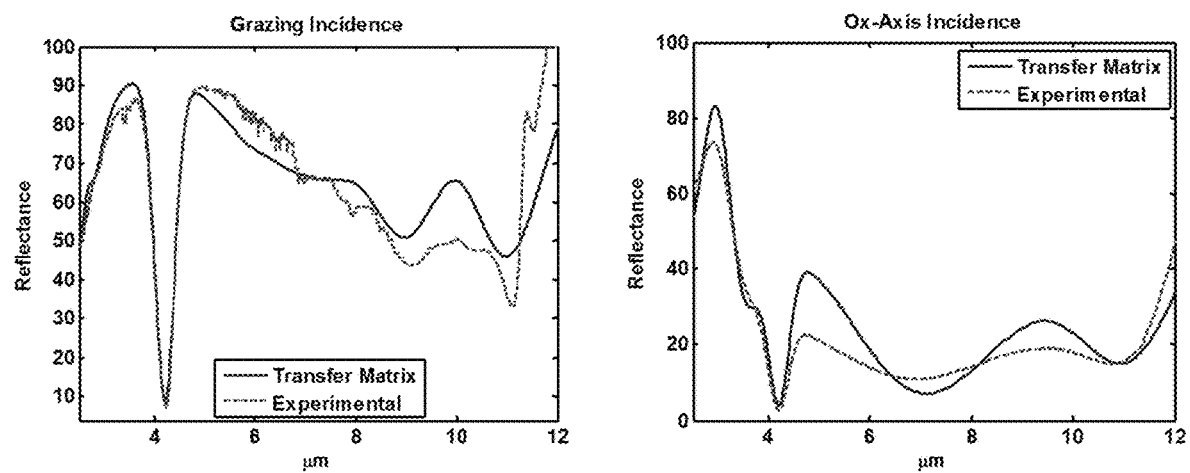
FIG. 7A is a set of plots showing grazing incidence reflectance of an AlN/GaN superlattice.
Figure 7B:
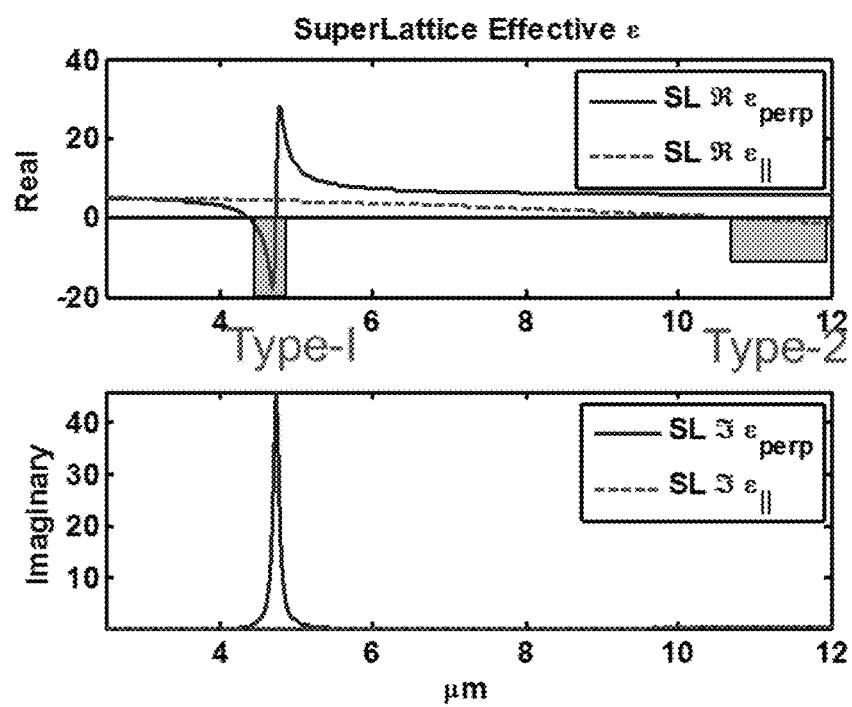
FIG. 7B shows real and imaginary effective permittivity in the perpendicular and parallel orientation for an AlN/2DEG/GaN superlattice as predicted by a transfer matrix method model.

An experimental demonstration of a semiconductor hyperbolic metamaterial is a 9×60 nm AlN/51 nm GaN superlattice on a Si substrate. This structure follows the general form of a superlattice hyperbolic metamaterial as given in FIG. 5 and FIG. 6. FIG. 7A shows that the dip in grazing incidence reflectance near 4.2 µm is characteristic of the negative perpendicular permittivity in a type-1 hyperbolic metamaterial with the layer thicknesses given and a 2DEG at the interface with $0.4\times10^{13}$ electrons/cm$^2$. Similarly, the increase in reflectance above 11 µm is characteristic of type-2 hyperbolic metamaterial behavior.

This AlN/2DEG/GaN superlattice on a Si substrate was modeled by a transfer matrix method model, which verified the type-I and type-2 regimes of the hyperbolic metamaterial as well as interference effects in the spectra. The longer wavelength peaks arise from transverse and optical phonons. The negative perpendicular permittivity near 4.2 µm is characteristic of a type-1 hyperbolic metamaterial, and the negative parallel permittivity above 11 µm is characteristic of type-2 hyperbolic metamaterial.

Figure 8:
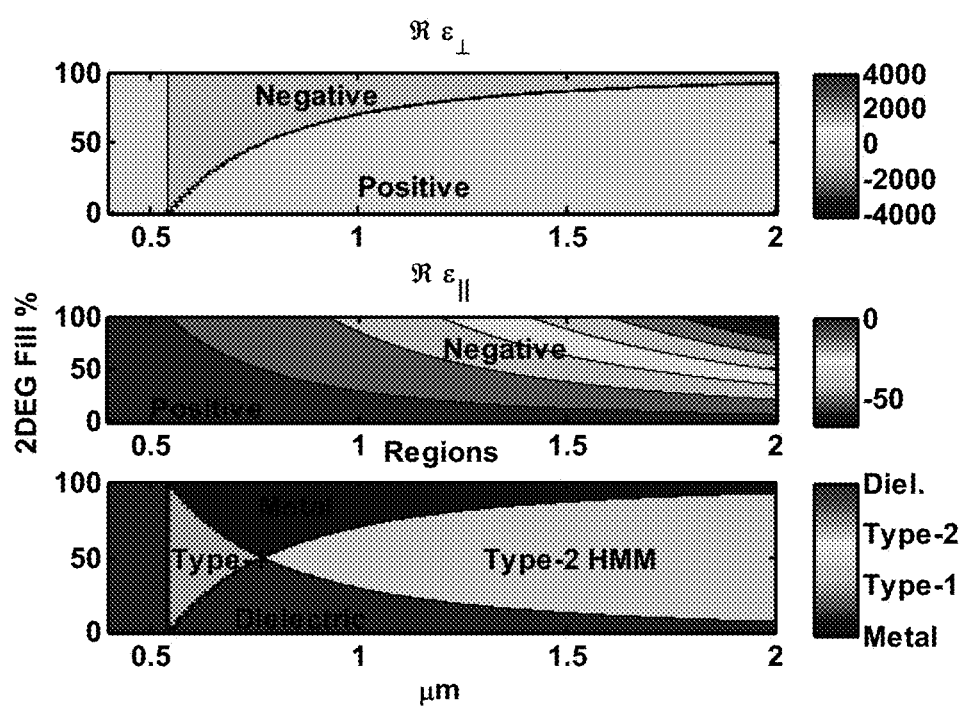
FIG. 8 shows an effective medium analysis of an AlN/GaN superlattice with a carrier concentration in the 2DEG of $4\times10^{13}$ electrons/cm$^2$.

It is known that thin pseudomorphic AlN layers can generate large polarization fields and large sheet carrier concentrations, which will shift the 2DEG plasma frequency into the visible. FIG. 8 shows an effective medium calculation of this structure with 2DEG with a sheet density of $4\times10^{13}$ electrons/cm$^2$. Specifically, the regions of positive and negative effective perpendicular permittivity, regions of positive and negative effective parallel permittivity, and regions of metallic, dielectric, type-1 hyperbolic metamaterial, and type-2 hyperbolic metamaterial response. Two application examples for a fill fraction of 10% are a green (approximately 0.55 µm) light emitter with a type-1 hyperbolic metamaterial and a 1.55 um waveguide with a type-2 hyperbolic metamaterial.

The semiconductor hyperbolic metamaterial and coupled semiconductor device can, for example, be composed of any wide-bandgap semiconductor including, for example, GaN/AlGaN/InGaN/InAlGaN, ZnO/MgZnO, ZnSe/ZnMgSe, CdTe/CdMnTe, ZnS, or any medium-bandgap or narrow-bandgap semiconductor including, for example, Si, Ge, GaAs, AlGaAs, InGaAs, InP, GaP, CuO$_2$, CuO, CuS, CuInGaSe$_2$, CuZnSnS$_2$, and similar alloys.

The semiconductor hyperbolic metamaterial can act independently or can be built without an active semiconductor device The semiconductor hyperbolic metamaterial or semiconductor device, or both can be formed into a defined structure or pattern by selective area epitaxy or post-growth etching.

The semiconductor hyperbolic metamaterial or semiconductor device can represent a single component in a multiple-component module.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A hyperbolic metamaterial assembly comprising a hyperbolic metamaterial in which one of an in-plane or an out-of-plane permittivity of the hyperbolic metamaterial is negative and the other is positive;

wherein the hyperbolic metamaterial comprises a plurality of repeating superlattice structures on a substrate, each superlattice structure comprising a first dielectric layer, a second dielectric layer, and a metallic layer disposed between the first and second dielectric layers;

wherein the first and second dielectric layers in each superlattice structure comprise first and a second low-doped semiconductor materials, the first low-doped semiconductor material being different from the second low-doped semiconductor material; and wherein each of the metallic layers comprises a two-dimensional electron or hole gas having a predetermined electron or hole concentration formed at an interface between the first and second low-doped semiconductor material layers;

wherein a doping level and a bandgap of each of the first and second low-doped semiconductor material layers are engineered to produce a predetermined electron or hole concentration in the corresponding two-dimensional electron or two-dimensional hole gas; and wherein the electron or hole concentration in each of the two-dimensional electron or hole gas layers produces a predetermined optical response in the metamaterial assembly.

2. The hyperbolic metamaterial assembly of claim 1, wherein the first low-doped semiconductor material is AlGaAs and the second low-doped semiconductor material is GaAs;
wherein the two-dimensional electron gas is formed at a heterointerface between the AlGaAs and GaAs material layers.

3. The hyperbolic metamaterial assembly of claim 1, further comprising a semiconductor light emitter,
wherein the hyperbolic metamaterial is configured to guide electromagnetic waves that are emitted by the light emitter away from said light emitter toward a photodetector.

4. The hyperbolic metamaterial assembly of claim 1, further comprising a semiconductor light emitter,
wherein the hyperbolic metamaterial is configured to reflect light emitted by the light emitter out of the assembly, thereby enhancing light recycling.

5. The hyperbolic metamaterial assembly of claim 1, further comprising a semiconductor light emitter positioned between the hyperbolic metamaterial and a reflector,
wherein the hyperbolic metamaterial and the reflector are configured to reflect light emitted by the light emitter toward each other, thereby enhancing the Q-factor of the cavity formed therebetween.

6. The hyperbolic metamaterial assembly of claim 1, further comprising a semiconductor light emitter with an active region built within the hyperbolic metamaterial and configured to produce strong light-matter coupling.

7. The hyperbolic metamaterial assembly of claim 1, further comprising a semiconductor light emitter with an active region built on or within the hyperbolic metamaterial and configured to produce amplified spontaneous emission or thresholdless lasing.

8. The hyperbolic metamaterial assembly of claim 1, further comprising a light detector evanescently coupled to the hyperbolic metamaterial.

9. The hyperbolic metamaterial assembly of claim 1, further comprising a controller configured to apply a voltage bias to the hyperbolic metamaterial, thereby modulating the concentration of electrons or holes therein.

10. The hyperbolic metamaterial assembly of claim 4, further comprising a light emitter, and
wherein the hyperbolic metamaterial is configured as an optical waveguide with respect to light emitted from the light emitter, and
wherein the controller is configured to modulate the optical properties of the hyperbolic metamaterial.

11. The hyperbolic metamaterial assembly of claim 1, further comprising a light emitter and a controller,
wherein the controller is configured to produce modulated light emitted from the light emitter, encoding information in the modulated light.

12. The hyperbolic metamaterial assembly of claim 11, wherein the modulated light emitted from the light emitter has a modulation frequency higher than 100 Hz, thereby being unperceivable by a human eye.

13. The hyperbolic metamaterial assembly of claim 12, further comprising a light bulb housing having an electrical interface, thereby configuring the hyperbolic metamaterial assembly for use in a light socket.

14. The hyperbolic metamaterial assembly of claim 12, further comprising a display screen backlit by the light emitter.

15. The hyperbolic metamaterial assembly of claim 1, further comprising a transistor built on or in the hyperbolic metamaterial, and
wherein the hyperbolic metamaterial is configured to dissipate heat produced by the transistor.

16. The hyperbolic metamaterial assembly of claim 1, wherein at least one of the first and second dielectric layers comprises a III-nitride material layer.

17. The hyperbolic metamaterial assembly of claim 1, wherein the first and second dielectric layers comprise AlN and GaN.

18. The hyperbolic metamaterial assembly of claim 1, wherein each of the repeating superlattice structures comprises AlN having a thickness of 3 nm and GaN having a thickness of 20 nm.

* * * * *